(12) United States Patent
Lin et al.

(10) Patent No.: US 8,633,423 B2
(45) Date of Patent: Jan. 21, 2014

(54) METHODS AND APPARATUS FOR CONTROLLING SUBSTRATE TEMPERATURE IN A PROCESS CHAMBER

(75) Inventors: Xing Lin, San Jose, CA (US); Douglas A. Buchberger, Jr., Livermore, CA (US); Xiaoping Zhou, San Jose, CA (US); Valentin Todorow, Palo Alto, CA (US); Andrew Nguyen, San Jose, CA (US); Anchel Sheyner, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/097,822

(22) Filed: Apr. 29, 2011

(65) Prior Publication Data

US 2012/0091108 A1    Apr. 19, 2012

Related U.S. Application Data

(60) Provisional application No. 61/393,312, filed on Oct. 14, 2010.

(51) Int. Cl.
*H05B 1/00* (2006.01)
*H01L 21/683* (2006.01)

(52) U.S. Cl.
USPC ..... 219/201; 219/544; 219/443.1; 219/465.1; 361/234; 156/345.52; 428/698; 428/332

(58) Field of Classification Search
USPC ............... 219/201, 544, 444.1, 443.1, 465.1; 361/234; 156/345.52; 428/698, 332
See application file for complete search history.

(56) References Cited

U.S. PATENT DOCUMENTS

| 6,891,263 B2 * | 5/2005 | Hiramatsu et al. ............ 257/703 |
| 2006/0291132 A1 * | 12/2006 | Kanno et al. .................. 361/234 |
| 2011/0180243 A1 | 7/2011 | Bera et al. |

* cited by examiner

*Primary Examiner* — Shawntina Fuqua
(74) *Attorney, Agent, or Firm* — Moser Taboada; Alan Taboada

(57) ABSTRACT

Methods and apparatus for controlling the temperature of a substrate during processing are provided herein. In some embodiments, an apparatus for retaining and controlling substrate temperature may include a puck of dielectric material; an electrode disposed in the puck proximate a surface of the puck upon which a substrate is to be retained; and a plurality of heater elements disposed in the puck and arranged in concentric rings to provide independent temperature control zones.

17 Claims, 5 Drawing Sheets

METHODS AND APPARATUS FOR CONTROLLING SUBSTRATE TEMPERATURE IN A PROCESS CHAMBER

CROSS-REFERENCE TO RELATED APPLICATIONS

This application claims benefit of U.S. provisional patent application Ser. No. 61/393,312, filed Oct. 14, 2010, which is herein incorporated by reference.

FIELD

Embodiments of the present invention generally relate to semiconductor processing and, more particularly, to methods and apparatus for controlling the temperature of a substrate during processing.

BACKGROUND

As the critical dimensions for semiconductor devices continue to shrink, there is an increased need for semiconductor process equipment that can uniformly process semiconductor substrates. One instance of where this need may arise is in controlling the temperature of a substrate disposed in a process chamber.

An electrostatic chuck within a processing chamber generally retains a substrate in a stationary position. While the substrate is held by an electrostatic chuck, various processes are applied to the substrate to, for example, deposit or remove material from the surface of the substrate. Variation in temperature across the substrate surface may cause nonuniform deposition or removal of material. Such nonuniformity can result in the fabrication of semiconductor devices that operate sub-optimally or do not operate at all.

Thus, the inventors have provided methods and apparatus for controlling temperature of a substrate during processing.

SUMMARY

Methods and apparatus for controlling the temperature of a substrate during processing are provided herein. In some embodiments, an apparatus for retaining and controlling substrate temperature may include a puck of dielectric material; an electrode disposed in the puck proximate a surface of the puck upon which a substrate is to be retained; and a plurality of heater elements disposed in the puck and arranged in concentric rings to provide independent temperature control zones.

In some embodiments, a method of retaining a substrate and controlling a temperature profile of the retained substrate may include energizing an electrode to electrostatically retain a substrate upon a surface of an electrostatic chuck; applying power to a heater disposed within the electrostatic chuck, wherein the heater comprises a plurality of concentric heater elements and the temperature of each heater element in the plurality of heater elements is independently controlled to create a temperature profile across the retained substrate.

In some embodiments, an apparatus for retaining a substrate and controlling a temperature profile of a substrate may include a process chamber having an electrostatic chuck disposed within the process chamber, the electrostatic chuck comprising a puck of dielectric material, an electrode disposed in the puck proximate a surface of the puck upon which a substrate is to be retained; and a plurality of heater elements disposed in the puck and arranged in concentric rings to provide independent temperature control zones; and a plurality of components disposed within the process chamber and positioned proximate the puck, the plurality of components configured to facilitate performing a process within the process chamber, wherein the four heater elements are sized and shaped to compensate for temperature non-uniformity created by the plurality of components.

Other embodiments and variations are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
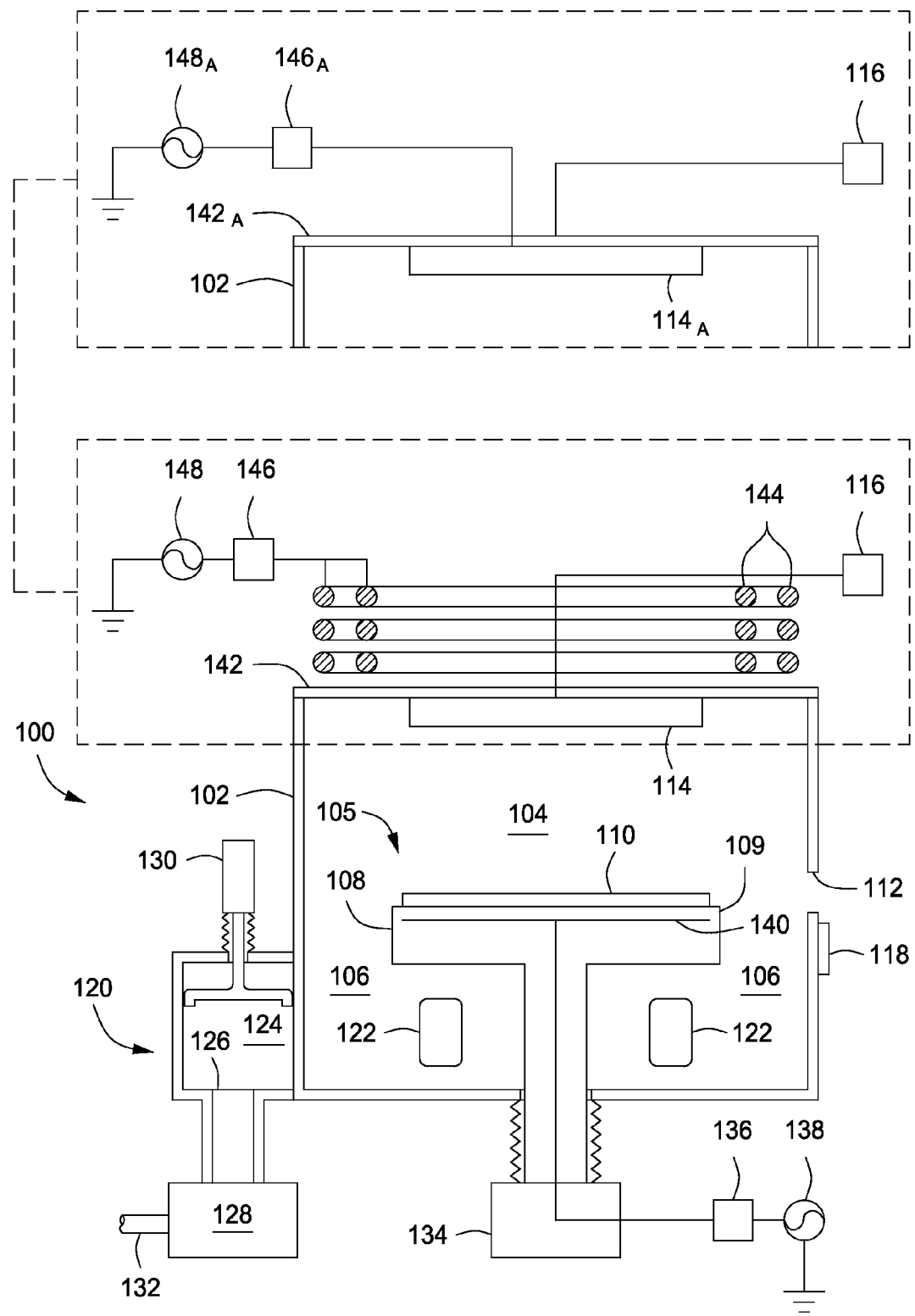
FIG. 1 depicts apparatus for processing semiconductor substrates in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of some embodiments may be beneficially incorporated in other embodiments without further recitation.

DETAILED DESCRIPTION

Embodiments of the present invention provide methods and apparatus for processing a substrate (e.g., a process chamber) having an electrostatic chuck with a plurality of heater elements embedded within the electrostatic chuck. Embodiments of the electrostatic chuck may facilitate creating a contoured temperature profile across a substrate being retained by the electrostatic chuck. Such a contoured temperature profile may be used to compensate for temperature or other non-uniformity within the process chamber.

FIG. 1 depicts an apparatus 100 in accordance with some embodiments of the present invention. The apparatus 100 may comprise a process chamber 102 having a substrate support 108 comprising an electrostatic chuck 109 for retaining a substrate 110 and imparting a temperature profile to the substrate 110. Exemplary process chambers may include the DPS®, ENABLER®, SIGMA™, ADVANTEDGE™, or other process chambers, available from Applied Materials, Inc. of Santa Clara, Calif. It is contemplated that other suitable chambers may be suitably modified in accordance with the teachings provided herein.

The process chamber 102 has an inner volume 105 that may include a processing volume 104 and an exhaust volume 106. The processing volume 104 may be defined, for example, between a substrate support 108 disposed within the process chamber 102 for supporting a substrate 110 thereupon during processing and one or more gas inlets, such as a showerhead 114 and/or nozzles provided at desired locations. In some embodiments, the substrate support 108 may include a mechanism that retains or supports the substrate 110 on the surface of the substrate support 108, such as an electrostatic chuck 109. In some embodiments, the substrate support 108 may include mechanisms for controlling the substrate temperature (such as heating and/or cooling devices, described with respect to FIGS. 2-6 below) and/or for controlling the species flux and/or ion energy proximate the substrate surface.

For example, in some embodiments, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing up to 12000 W at a frequency of about 2 MHz, or about 13.56 MHz, or about 60 MHz. In some embodiments, two bias power sources may be provided for coupling RF power through respective matching networks to the RF bias electrode 140 at a frequency of about 2 MHz and about 13.56 MHz. In some embodiments, three bias power sources may be provided for coupling RF power through respective matching networks to the RF bias electrode 140 at a frequency of about 2 MHz, about 13.56 MHz, and about 60 MHz. The at least one bias power source may provide either continuous or pulsed power. In some embodiments, the bias power source may be a DC or pulsed DC source.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

The one or more gas inlets (e.g., the showerhead 114, $114_A$) may be coupled to a gas supply 116 for providing one or more process gases into the processing volume 104 of the process chamber 102. Although a showerhead 114, $114_A$ is shown in FIG. 1, additional or alternative gas inlets may be provided, such as nozzles or inlets disposed in the ceiling 142, $142_A$ or on the sidewalls of the process chamber 102 or at other locations suitable for providing gases as desired to the process chamber 102, such as the base of the process chamber, the periphery of the substrate support, or the like.

One or more plasma power sources (one RF power source 148, $148_A$ shown) may be coupled to the process chamber 102 to supply RF power to the target 114, $114_A$ via one or more respective match networks (one match network 146, $146_A$ shown). In some embodiments, the apparatus 100 may utilize inductively coupled RF power for processing. For example, the process chamber 102 may have a ceiling 142, $142_A$ made from a dielectric material and a dielectric showerhead 114, $114_A$. The ceiling 142, $142_A$ may be substantially flat, although other types of ceilings, such as dome-shaped ceilings or the like, may also be utilized. In some embodiments, an antenna comprising at least one inductive coil element (two co-axial inductive coil elements 144 are shown) may be disposed above the ceiling 142, $142_A$. The inductive coil elements 144 are coupled to one or more RF power sources (one RF power source 148 shown) through one or more respective matching networks (matching network 146 shown). The one or more plasma sources may be capable of producing up to 5000 W at a frequency of about 2 MHz and/or about 13.56 MHz, or higher frequency, such as 27 MHz and/or 60 MHz. In some embodiments, two RF power sources may be coupled to the inductive coil elements 144 through respective matching networks for providing RF power at frequencies of about 2 MHz and about 13.56 MHz.

The exhaust volume 106 may be defined, for example, between the substrate support 108 and a bottom of the process chamber 102. The exhaust volume 106 may be fluidly coupled to the exhaust system 120, or may be considered a part of the exhaust system 120. The exhaust system 120 generally includes a pumping plenum 124 and one or more conduits that couple the pumping plenum 124 to the inner volume 105 (and generally, the exhaust volume 104) of the process chamber 102.

Each conduit has an inlet 122 coupled to the inner volume 105 (or, in some embodiments, the exhaust volume 106) and an outlet (not shown) fluidly coupled to the pumping plenum 124. For example, each conduit may have an inlet 122 disposed in a lower region of a sidewall or a floor of the process chamber 102. In some embodiments, the inlets are substantially equidistantly spaced from each other.

A vacuum pump 128 may be coupled to the pumping plenum 124 via a pumping port 126 for pumping out the exhaust gases from the process chamber 102. The vacuum pump 128 may be fluidly coupled to an exhaust outlet 132 for routing the exhaust as required to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

Figure 2:
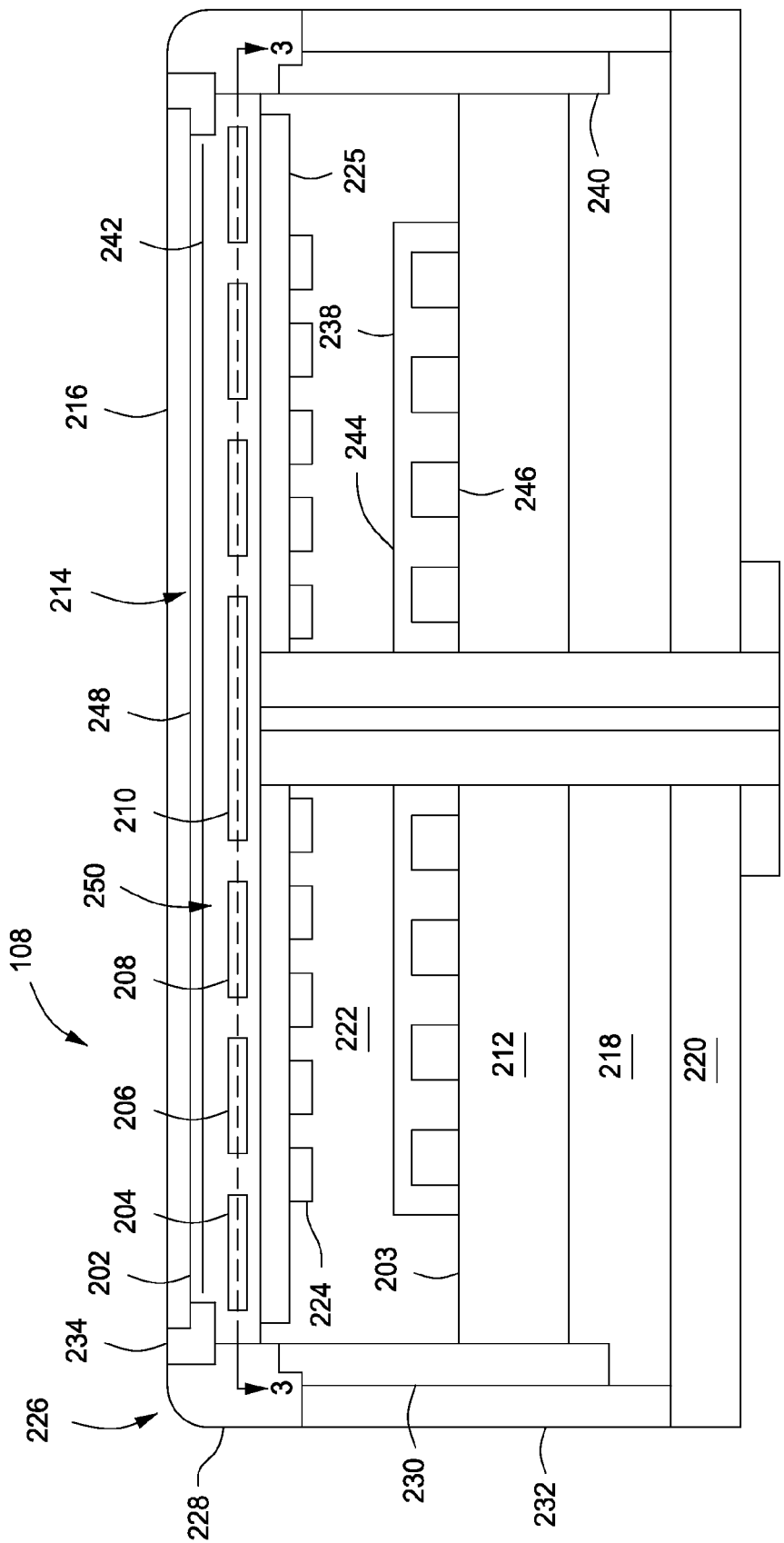
FIG. 2 depicts a vertical cross-sectional view of the pedestal of FIG. 1 in accordance with some embodiments of the present invention.

FIG. 2 depicts a vertical cross-sectional view of the substrate support 108 in accordance with at least some embodiments of the invention. The substrate support 108 may include a ground plate 220, an insulator plate 218, a facility plate 212, a cooling plate 238, an electrostatic chuck 214, backside gas distribution plate 222 and a process kit 226. It is contemplated that, in some embodiments, one or more of the ground plate 220, insulator plate 218, facility plate 212, cooling plate 238, electrostatic chuck 214, and backside gas distribution plate 222 may be combined into a singular component providing the combined functions of each element. Alternatively or in combination, in some embodiments, one or more of the ground plate 220, insulator plate 218, facility plate 212, cooling plate 238, electrostatic chuck 214, and backside gas distribution plate 222 may be omitted.

The ground plate 220 is a conductive plate that supports the insulator plate 218. The ground plate to 220 is fabricated of a conductive material that forms an electrical ground for electrical signals and voltages applied to the substrate support 108. In some embodiments, the ground plate may be cylindrical, although other geometries may be used. The insulator plate 218 is fabricated from an insulative material that separates the facility plate 212 from the ground plate 220. The facility plate 212 comprises a plenum for distributing cooling fluid to the cooling plate 238 located beneath the electrostatic chuck 214 as well as electrical buses for coupling power, control, and monitoring signals to/from the electrostatic chuck. The facility plate 212 supports the backside gas distribution plate 222 and the cooling plate 238.

In some embodiments, the process kit 226 may include an edge ring 234, an outer sleeve 232, a collar 228, and an inner sleeve 230. The inner sleeve 230 is cylindrical and circumscribes an outer diameter of the electrostatic chuck 214, the facility plate 212, and rests upon a notch 240 in the edge of the top surface of the insulator plate 218. The outer sleeve 232 circumscribes the inner sleeve and is supported by the ground plate 220. In some embodiments, the inner and outer sleeves 230 and 232 are fabricated from anodized aluminum. The collar 228 rests upon a top edge of the inner and outer sleeves 230 and 232.

The backside gas distribution plate 222 includes a plenum 224 for distributing a backside gas (e.g., helium) to the electrostatic chuck 214 via one or more conduits (not shown) disposed in a support plate 225 disposed beneath the electrostatic chuck 214. The plate 222 defines a cavity 244 in which is positioned a cooling plate 238. The cooling plate 238 and backside gas distribution plate 222 are fabricated of thermally conductive materials, e.g., aluminum. The bottom surface of the plates 222 and 238 meet the facility plate 212 at interface 203. The facility plate 212 comprises conduits (not shown) that couple backside gas and coolant to the plates 222 and 238 and their respective plenums 224 and 246. The structure of the cooling plate 238 is described in detail with respect to FIG. 6 below.

The electrostatic chuck 214 has a top surface 202 upon which a substrate 216 rests and is retained during processing. The electrostatic chuck 214 includes a puck 248 having a top surface 202 for supporting the substrate and a bottom surface abutting the top of the backside gas distribution plate 212. The puck 248 is fabricated of material having a high dielectric constant such as ceramic. The puck 248 includes an electrode 242 (e.g., a conductive mesh) that, when energized with a DC voltage, creates an electrostatic field between the substrate 216 and the puck 214. The electrostatic field retains the substrate 216 upon the surface 202 of the electrostatic chuck 214. The electrode 242 may also be used as an RF bias electrode (140 in FIG. 1). The electrostatic chuck 214 further includes a heater 250 embedded in the puck 248. More specifically, the heater 250 includes a plurality of heater elements 204, 206, 208, and 210 embedded in the puck 248. The heater elements 204, 206, 208, and 210 are arranged in independently controllable, zones, such as concentric zones, as described in greater detail with respect to FIG. 3, below.

The process kit 226, comprising the sleeves 230, 232, the collar 228, and the edge ring 234, protects the edge and sides of the substrate support 108 from being degraded by plasma and various gases used during substrate processing. The edge ring 234 circumscribes the edge of the puck 248 and may include a portion that extends beneath the substrate 216 and a portion that abuts the collar 228.

Figure 3:
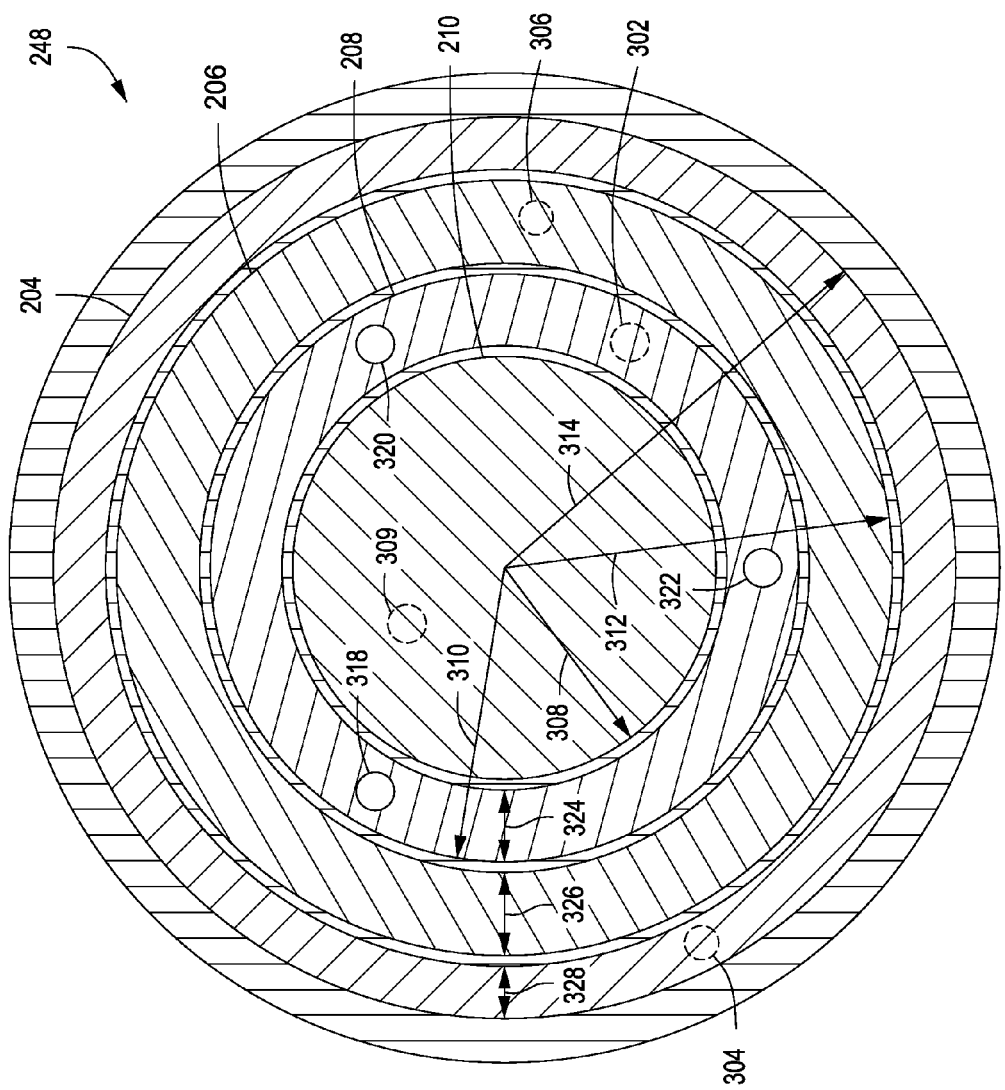
FIG. 3 depicts a horizontal, cross-sectional view of an electrostatic chuck, taken along line 3-3 of FIG. 2, in accordance with some embodiments of the present invention.

FIG. 3 depicts a horizontal cross-section of the electrostatic chuck 214 taken along line 3-3 of FIG. 2, through the plane of the heater 250. The view depicts some embodiments of an arrangement of the heater elements 204, 206, 208, 210. In some embodiments, the heating zones are concentrically arranged as rings, for example as shown in the figure. In some embodiments, the elements 204, 206, 208, 210 are fabricated using conductive mesh embedded in the ceramic material of the puck 248.

In some embodiments, the first zone (for example, a circular plate forming the heater element 210) may have a radius 308 of about 3.45 inches (8.76 cm). The second zone (heater element 208) may have a width 324 of about 3 inches (7.62 cm) and extend from proximate the outer diameter of the first zone to a radius 310 of 6.45 inches (16.38 cm). The third zone (heater element 206) may have a width 326 of about 1 inch (2.54 cm) and extend from proximate the outer diameter of the second zone to a radius 312 of 11 inches (27.94 cm). The fourth zone (heater element 204) may have a width 328 of about 1.1 inches (2.79 cm) and extend from proximate the outer diameter of the third zone to a radius 314 of 12.1 inches (30.73 cm). In some embodiments, the spacing between elements may be about 0.1 inches (0.254 cm). One or more temperature control probes 302, 304, 306, 309 may be provided to abut respective one or more heater elements 204, 206, 208, 210. The temperature control probes provide indicia of the temperature in each zone beneath the substrate. The probes may be optical or electrical temperature measuring devices. A plurality of liftpin holes 318, 320, 322 are provided in the puck 248 to facilitate vertical movement of the lift pins through the puck 248. Such lift pin movement facilitates placing the substrate on, and removing the substrate from, the surface 202 of the chuck 214.

In some embodiments, the diameters and positioning of the concentric heater elements are designed to compensate for temperature nonuniformity created by various components of the process chamber. The components may be any component of the process chamber configured to facilitate performing a process within the process chamber, such as temperature controlled process chamber sidewalls or a plasma power source (e.g., RF power source 148, $148_A$, inductive coil element 144, or the like). For example, when the RF coils are energized they may produce an M-shaped heating profile across the substrate, e.g., lower temperature at the edge and center of the substrate and higher temperature in a middle band of the substrate. By judiciously controlling the temperature of the heater elements 204, 206, 208, 210 to form a complementary W-shaped heating profile, the M-shaped heating profile produced by the coils is compensated to form a uniform heating profile during processing. In some embodiments, the heater elements may be positioned and/or controlled in other arrangements to compensate for other temperature profile nonuniformities.

Figure 4:
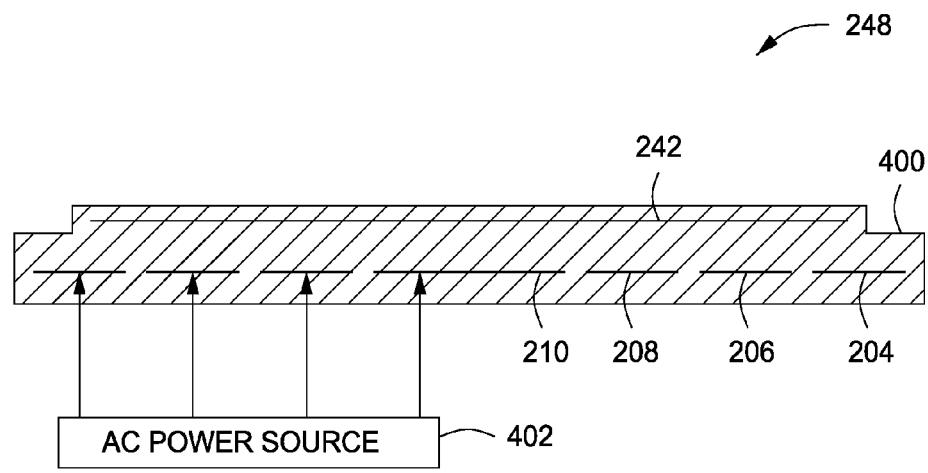
FIG. 4 depicts a vertical cross-sectional view of a puck component of the electrostatic chuck.

FIG. 4 depicts a vertical cross-section of the puck 248 in accordance with some embodiments of the invention. The puck 248 is a cylinder having a circumferential notch 400 to support an edge ring (ring 234 in FIG. 2). Embedded within the ceramic material of the puck 248 and located near the surface of the puck 248 is the chucking electrode 242 (e.g., a conductive mesh). The chucking electrode 242, when a voltage is applied, forms an electrostatic field between the surface of the puck 248 and the substrate (216 in FIG. 2) that attracts the substrate towards the puck 248. Beneath the electrode 242 and embedded within the ceramic material of the puck 248 are the heater elements 204, 206, 208, and 210. In some embodiments of the invention, the heater elements 204, 206, 208, 210 are coupled to at least one AC power source 402 to provide electrical current to heat the heater element and the surrounding ceramic material. In some embodiments of the invention, heater element 210 has a resistance of 9.9 ohms and produces up to 4.4 kW of heat; heater element 208 has a resistance of 9.6 ohms and produces up to 4.5 kW of heat; heater element 206 has a resistance of 10 ohms and produces up to 2.1 kW of heat; heater element 204 has a resistance of 20 ohms and produces up to 2.1 kW of heat. By using concentric heater elements embedded within the puck 248, a substrate temperature profile can be created and dynamically controlled during processing. Temperature control of the heater elements is provided at least in part through adjusting the AC power applied to each heater from the AC power source 402.

The heater element 204 extends beneath the edge ring notch 400 to ensure the temperature profile can be controlled across the entire diameter of the substrate, i.e., the heater element extends beyond the edge of the substrate. Because of the edge ring, as well as a backside gas exclusion zone circumscribing the puck 248, the edge of a substrate may have a substantially different temperature than the center during processing. Consequently, having the heater element extend beyond the edge of the substrate facilitates greater control of the temperature at the substrate edge.

Figure 5:
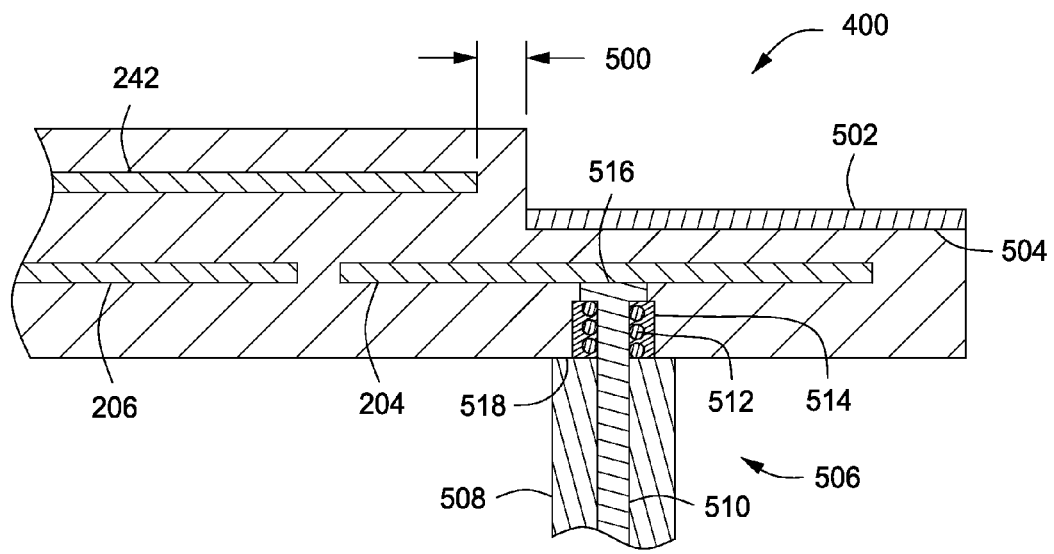
FIG. 5 depicts a vertical cross-section of a portion of the puck of FIG. 4 in accordance with some embodiments of the invention.

FIG. 5 depicts a detailed vertical cross-section of the edge portion of the puck 248 of FIG. 4 in accordance with some embodiments of the present invention. In some embodiments, the electrode 242 may extend to within a distance 500 of approximately 1 mm from the notch 400. By extending the chucking electrode proximate the notch 400, the chucking forces at the edge of the substrate are increased. In addition, in some embodiments, a DC electrode 502 may be formed upon the horizontal surface 504 of the notch 400. By including the DC electrode 502 beneath and in contact with the edge ring (not shown in FIG. 5), power coupling is provided beyond the substrate edge.

In some embodiments, to provide AC power to the heater elements, a spring-loaded terminal 506 couples AC power to heater element 204. Each of the other heater elements 206, 208, and 210 have a similar terminal as terminal 506 to couple power to each respective element. In some embodiments, each terminal 506 is coupled to an independently controllable AC power source (e.g., 402 in FIG. 4).

In some embodiments, the terminal 506 may include a cylindrical insulator 508 surrounding a conductor 510. A spring 512 is positioned within a cavity 514 formed in the bottom surface of the puck 248 and circumscribes the conductor 510. The spring 512 is captured between the top surface 518 of the insulator 508 and a head 516 of the conductor 510. In this manner the spring 512 of biases the conductor 516 against the heater element 204 to establish a conductive path from the conductor 510 to the heater element 504.

Figure 6:
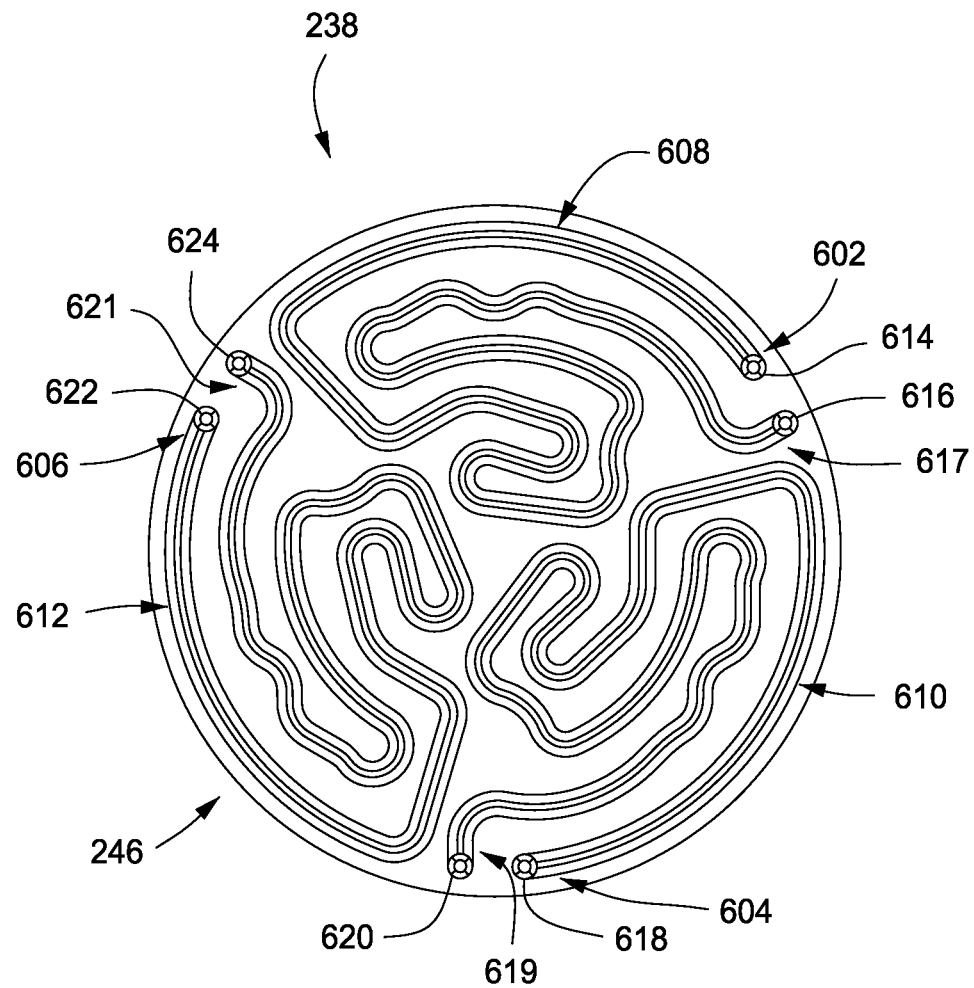
FIG. 6 depicts a schematic top view of a cooling plate in accordance with some embodiments of the present invention.

FIG. 6 depicts a schematic, top view of the cooling plate 238 of FIG. 2 in accordance with some embodiments of the present invention. In some embodiments, the cooling plate comprises a plurality of channels 246. One or more of the plurality of channels 246 define a plurality of flow paths (three shown) 608, 610, 612 having substantially equal fluid conductance and residence time. In such embodiments, each of the plurality of flow paths 608, 610, 612 comprises an inlet 614, 618, 622 coupled to a first end 602, 604, 606 and an outlet 616, 620, 624 coupled to a second end 617, 619, 621, thus providing a flow path of heat transfer fluid from the inlet 614, 618, 622 to the respective outlet 616, 620, 624. The plurality of flow paths 608, 610, 612 may be coupled to a single heat transfer fluid source (described above with respect to FIG. 1). For example, a heat transfer fluid outlet may be coupled to the plurality of outlets to provide an outflow of heat transfer fluid from the plurality of outlets to the heat transfer fluid source. Alternatively, the plurality of flow paths may be coupled to a plurality of heat transfer fluid sources, wherein each of the plurality of flow paths 608, 610, 612 are respectively coupled to a separate single heat transfer fluid source.

The plurality of flow paths 608, 610, 612 may be arranged in any manner suitable to provide temperature uniformity throughout the substrate support 108. For example, in some embodiments, the plurality of flow paths 608, 610, 612 may be symmetrically positioned within the substrate support 108 to promote temperature uniformity. By utilizing a plurality of flow paths 608, 610, 612 the axial length of each of the plurality of flow paths 608, 610, 612 may be shortened, which may advantageously allow for a decreased change in temperature of the heat transfer fluid along the flow paths 608, 610, 612 and thus an increased control over temperature profile due to thermodynamic principles (e.g., residence time, fluid conductance, decreased pressure drop). In addition, by utilizing a plurality of flow paths 608, 610, 612 wherein each comprises an inlet 614, 618, 622, and outlet 616, 620, 624, the total flow rate of heat transfer fluid throughout the substrate support may be increased, further facilitating a decreased temperature range of the substrate support during use. In some embodiments, each of the plurality of flow paths may be arranged to provide a counter flow within a given flow path. In some embodiments, each portion of the flow path adjacent to another flow path can be configured to provide counter flow. By providing each flow path, and optionally adjacent flow paths, in a counter flow configuration, temperature uniformity further improves.

In some embodiments, to control the substrate temperature, the substrate support 108 utilizes both the cooling plate 238 and heater 250 (described above). The combination of heating and cooling ability facilitates substantial control over the generation of temperature profiles across the substrate during processing. Varying heat transfer fluid flow and/or AC power application in response to signals from the temperature probes enables dynamic control of the temperature profile during processing.

Thus, methods and apparatus for processing substrates have been provided herein that provide improved temperature control across a substrate (for example, to provide temperature uniformity). Improved temperature control may facilitate improved control over substrate processes that are temperature dependent. For example, improved temperature uniformity may facilitate improvement of substrate processing, such as etching, deposition, or other processes that may benefit from temperature uniformity.

While the foregoing is directed to embodiments of the present invention, other and further embodiments of the invention may be devised without departing from the basic scope thereof.

What is claimed is:

1. Apparatus for retaining a substrate and controlling a temperature profile of a substrate comprising:
   a puck of dielectric material;
   an electrode, disposed in the puck proximate a surface of the puck upon which a substrate is to be retained;
   a plurality of heater elements, disposed in the puck, beneath the electrode, and arranged in concentric rings, to provide independent temperature control zones; and
   a process chamber having a plurality of components positioned proximate the puck and adapted to process a retained substrate, wherein the plurality of heater elements are sized and shaped to compensate for temperature non-uniformity created by the plurality of components, and wherein the plurality of components comprise RF coils.

2. The apparatus of claim 1, wherein the puck is fabricated of a ceramic material.

3. The apparatus of claim 1, wherein the electrode extends to within about 1mm of an edge of the puck.

4. The apparatus of claim 1, wherein an outermost heater element spans a portion of the puck where an edge of the substrate is located when a substrate is retained on the puck.

5. The apparatus of claim 1, wherein the plurality of heater elements comprises four heater elements.

6. The apparatus of claim 1 further comprising a cooling plate, thermally coupled to the puck, for transferring heat from the puck.

7. The apparatus of claim 6, wherein the cooling plate comprises a plurality of cooling zones.

8. The apparatus of claim 7, wherein each zone in the plurality of cooling zones is independently controlled to provide an independent amount of heat transfer.

9. The apparatus of claim 1, further comprising:
an AC power source, coupled to the plurality of heater elements, to provide independent heating control of each of the heater elements in the plurality of heating elements.

10. Apparatus for retaining a substrate and controlling a temperature profile of a substrate comprising:
a puck of dielectric material;
an electrode, disposed in the puck proximate a surface of the puck upon which a substrate is to be retained;
a plurality of heater elements, disposed in the puck, beneath the electrode, and arranged in concentric rings, to provide independent temperature control zones; and
an AC power source, coupled to the plurality of heater elements, to provide independent heating control of each of the heater elements in the plurality of heating elements,
wherein the plurality of heater elements create an M-shaped temperature profile for a retained substrate.

11. A method of retaining a substrate and controlling a temperature profile of the retained substrate comprising:
energizing an electrode to electrostatically retain a substrate upon a surface of a puck of an electrostatic chuck;
applying power to a heater disposed within the puck and beneath the electrode, wherein the heater comprises a plurality of concentric heater elements and the temperature of each heater element in the plurality of heater elements is independently controlled to create a temperature profile across the retained substrate, wherein the temperature profile is M-shaped.

12. The method of claim 11, wherein an outermost concentric heater element extends beyond an edge of the retained substrate to control the temperature of the edge.

13. The method of claim 11, further comprising controlling an amount of heat transfer to a cooling plate positioned proximate to the electrostatic chuck.

14. The method of claim 13, wherein the amount of heat transfer is controlled within cooling zones.

15. The method of claim 11, wherein the electrode extends to within 1mm of an edge of the electrostatic chuck.

16. The apparatus of claim 9, further comprising a spring-loaded terminal that couples to the AC power source to the plurality of heater elements.

17. The apparatus of claim 1, wherein the electrode extends to within about 1mm of an edge of the puck, wherein an outermost heater element spans a portion of the puck where an edge of the substrate is located when a substrate is retained on the puck, and wherein the plurality of heater elements comprises four heater elements.

* * * * *